(12) United States Patent
Sastrawan et al.

(10) Patent No.: US 9,362,929 B2
(45) Date of Patent: Jun. 7, 2016

(54) CONTROLLING OSCILLATORS

(71) Applicant: The University of Sydney, Sydney (AU)

(72) Inventors: Jarrah Sastrawan, Sydney (AU);
Michael J. Biercuk, Sydney (AU)

(73) Assignee: The University of Sydney (AU)

( * ) Notice: Subject to any disclaimer, the term of this patent is extended or adjusted under 35 U.S.C. 154(b) by 0 days.

(21) Appl. No.: 14/555,927

(22) Filed: Nov. 28, 2014

(65) Prior Publication Data

US 2016/0013795 A1    Jan. 14, 2016

(30) Foreign Application Priority Data

Jul. 11, 2014    (AU) .................................. 2014902678

(51) Int. Cl.
| | | |
|---|---|---|
| *H03L 7/26* | (2006.01) | |
| *H03L 1/02* | (2006.01) | |
| *G04F 5/14* | (2006.01) | |

(52) U.S. Cl.
CPC .. *H03L 7/26* (2013.01); *G04F 5/14* (2013.01); *H03L 1/026* (2013.01)

(58) Field of Classification Search
CPC ........... G04F 5/14; G04F 5/145; H03B 17/00; H03L 1/025; H03L 1/026; H03L 1/085; H03L 7/26
USPC ........................... 331/3, 17, 18, 44, 94.1, 176
See application file for complete search history.

(56) References Cited

U.S. PATENT DOCUMENTS

| | | | | |
|---|---|---|---|---|
| 4,899,117 A | * | 2/1990 | Vig ............................ | H03L 7/22 331/176 |
| 5,892,408 A | * | 4/1999 | Binder .................... | H03L 1/026 331/176 |
| 6,522,212 B1 | * | 2/2003 | Kodim ..................... | H03B 5/04 331/116 R |
| 6,587,005 B2 | * | 7/2003 | Ichihara ................... | H03L 7/18 331/16 |
| 6,710,663 B1 | * | 3/2004 | Berquist ................. | H03L 1/026 331/3 |
| 7,015,762 B1 | * | 3/2006 | Nicholls ................... | H03L 1/00 331/10 |

(Continued)

OTHER PUBLICATIONS

Hagemann, C., et al., "Providing $10^{-16}$ Short-Term Stability of a 1.5-µm Laser to Optical Clocks", *IEEE Transactions on Instrumentation and Measurement*, 62(6), (2013), 1-6.

(Continued)

*Primary Examiner* — Levi Gannon
(74) *Attorney, Agent, or Firm* — Schwegman, Lundberg & Woessner, P.A.

(57) ABSTRACT

This disclosure relates to controlling an oscillator based on a measurement of a frequency reference. A controller determines a control value to control the oscillator based on multiple error values. Each error value is indicative of a measurement of a frequency difference between the oscillator and a frequency reference over a period of time. The determination of the error value is further based on an application time value indicative of a time of application of the control value to the oscillator. Since the control value is based on the application time the controller can compensate for inaccuracies arising from both evolution of the oscillator between measurements and applying the correction at a later time after the measurement. Further, since the multiple error values represent a frequency difference over different periods of time, the controller can compensate for wide range of statistical effects.

18 Claims, 7 Drawing Sheets

(56) References Cited

U.S. PATENT DOCUMENTS

| | | | | |
|---|---|---|---|---|
| 7,292,109 | B2* | 11/2007 | Haiut | G04G 3/02 331/44 |
| 8,975,970 | B2* | 3/2015 | Sonntag | H03L 7/00 327/155 |
| 2001/0048349 | A1* | 12/2001 | Matsumoto | H03B 5/04 331/25 |
| 2005/0093638 | A1* | 5/2005 | Lin | H03L 1/026 331/176 |
| 2007/0155341 | A1* | 7/2007 | Haiut | H03L 1/026 455/75 |

OTHER PUBLICATIONS

Mullan, Michael, et al., "Optimizing Passive Quantum Clocks", arXiv:1404.3810v1 [quant-ph] Apr. 15, 2014; Department of Physics, University of Colorado, Boulder, Colorado; and National Institute of Standards and Technology, Boulder, Colorado, (Apr. 15, 2014), 25 pgs.

Rutman, Jacques, "Characterization of Phase and Frequency Instabilities in Precision Frequency Sources: Fifteen Years of Progress", *Proceedings of the IEEE*, 66(9), (1978), 1048-1075.

\* cited by examiner

CONTROLLING OSCILLATORS

CLAIM OF PRIORITY

This application claims the benefit of priority of Australian Patent Application No. 2014902678, entitled "CONTROLLING OSCILLATORS," filed on Jul. 11, 2014, the benefit of priority of which is claimed hereby, and which is incorporated by reference herein in its entirety.

TECHNICAL FIELD

This disclosure relates to controlling an oscillator based on a measurement of a frequency reference.

BACKGROUND ART

Frequency standards are devices that produce a signal whose frequency displays extremely small fluctuations over the long term. These fluctuations are called instability, generally quantified as a fractional deviation or fractional variance. One of the chief goals in the development of frequency standards is to reduce instability and so increase the precision of the output frequency, with the best current standards achieving fractional instability $\approx 10^{-18}$. Clocks are a derivative technology of frequency standards, which are based on some frequency standard, whose stability is a measure of the frequency deviation of its output 'tick' signal.

Frequency can be more precisely measured than other physical quantities and therefore, frequency standards serve as the basis for the definitions of other physical units. One application of frequency standards is an atomic clock, which maintains international time. High-stability frequency standards are also used for the operation of global positioning systems and for geodesy, as well as laboratory tests of fundamental physics. Frequency standards are classified into active and passive types.

Active frequency standards are self-sustaining oscillators whose very high stability is generally quantified by their quality factor. Such standards are often also called 'openloop' and perform best on relatively short timescales (10-100 s). State-of-the-art frequency standards achieve extremely low instability through a passive configuration. In general, passive standards such as atomic beam and fountain clocks, trapped ion clocks and optical lattice clocks, achieve better long-term stability than active standards [1].

A major limit to the performance of passive frequency standards comes from the quality of the local oscillator (LO) used to interrogate the atomic transition. The LO frequency evolves randomly in time due to intrinsic instabilities from the underlying hardware, leading to deviations of the LO frequency from that of the stable atomic reference.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

A computer implemented method for controlling an oscillator, the method comprises determining a control value to control the oscillator based on multiple error values, each error value being indicative of a measurement of a frequency difference between the oscillator and a frequency reference over a period of time, and based on an application time value indicative of a time of application of the control value to the oscillator.

Many control methods assume that the correction to the oscillator is applied exactly when the frequency error is measured. A perfect knowledge of the frequency error would lead to perfect compensation. However, in practical applications, the oscillator evolves between the measurement and the compensation (the dead time) which leads to inaccuracies. In addition, many methods do not account for additional dead time incurred between measurements when the oscillator evolves without compensation.

In the above method the control value is based on the application time, and therefore, this method can compensate for inaccuracies arising from both evolution of the oscillator between measurements and applying the correction at a later time after the measurement. This is an advantage over other methods which are less accurate.

Further, since the multiple error values represent a frequency difference over different periods of time, the resulting control value is statistically more significant than using a single error value. As a result, controlling the oscillator with the control value can compensate for more statistical effects and consequentially leads to a more accurate correction and a more stable oscillator output. This is a clear advantage over other methods with a feedback loop using a single measurement.

Determining the control value may comprise:
  determining based on the multiple error values a predicted value indicative of a predicted frequency difference between the oscillator and the frequency reference at the time of application of the control value to the oscillator; and
  determining the control value based on the predicted value.

Determining the predicted value may comprise:
  determining a correlation measure indicative of a correlation of the multiple error values and the predicted value; and
  determining the predicted value based on the correlation measure.

Each of the multiple error values may be associated with a measurement time value indicative of a time of the measurement of the frequency difference and determining the control value may comprise determining the control value based on the measurement time value associated with each of the multiple error values.

Determining the control value may comprise determining the control value based on noise data indicative of statistical noise characteristics of the oscillator and the noise data may be indicative of a noise power spectrum.

Determining the control value may comprise:
  determining multiple weighting coefficients for the multiple error values based on the multiple error values; and
  determining the control value to control the oscillator based on the multiple error values modified according to the multiple weighting coefficients.

Determining the control value may comprise determining a linear combination of the multiple error values weighted by the multiple weighting coefficients.

Each of the multiple error values may be associated with a measurement duration value indicative of a duration of the measurement of the frequency difference and determining the control value may comprise determining the control value based on the measurement duration value associated with each of the multiple error values.

The multiple error values may comprise a first error value associated with a first measurement duration value indicative of a first duration of a first measurement of the frequency difference and a second error value associated with a second measurement duration value indicative of a second duration of a second measurement of the frequency difference. The first duration of the first measurement may be relatively long to sample low frequency noise of the oscillator and the second duration of the second measurement may be relatively short to sample high frequency noise of the oscillator.

The duration of the measurement may be defined between two exposure periods of the frequency reference to the frequency of the oscillator such that each of the multiple error values is indicative of an accumulated phase difference between the oscillator and the frequency reference.

The method may further comprise performing an optimisation to determine the multiple duration values for obtaining the multiple error values.

The method of any one of the preceding claims, wherein determining the control value comprises determining the control value based on a transfer function indicative of an influence of fluctuations of the oscillator on the multiple error values.

The method may further comprise determining a covariance matrix based on the transfer function wherein determining the control value may comprise determining the control value based on the covariance matrix.

Software, when installed on a computer, causes the computer to perform the above method.

A computer system for controlling an oscillator comprises:
an input port to receive multiple error values, each error value being indicative of a measurement of a frequency difference between the oscillator and a frequency reference over a period of time; and
a processor to determine a control value to control the oscillator based on the multiple error values and based on an application time value indicative of a time of application of the control value to the oscillator.

A method for generating a clock signal comprises:
generating the clock signal based on oscillations of an oscillator;
performing multiple measurements of a frequency difference between the oscillator and a frequency reference over a period of time;
determining multiple error values such that each error value is indicative of one of the multiple measurements;
determining a control value to control the oscillator based on the multiple error values and based on an application time value indicative of a time of application of the control value to the oscillator; and
applying the control value to the oscillator at the time of application.

Measuring the frequency difference may comprise measuring an accumulated phase difference.

A clock comprises:
an oscillator and a detector to generate a clock signal based on oscillations of the oscillator;
a frequency reference;
a measurement system
to perform multiple measurements of a frequency difference between the oscillator and the frequency reference over a period of time; and
a processor to
determine multiple error values such that each error value is indicative of one of the multiple measurements;
determine a control value to control the oscillator based on the multiple error values and based on an application time value indicative of a time of application of the control value to the oscillator; and
apply the control value to the oscillator at the time of application.

The frequency reference may be an atomic frequency reference.

Optional features described of any aspect of method, computer readable medium or computer system, where appropriate, similarly apply to the other aspects also described here.

BRIEF DESCRIPTION OF DRAWINGS

An example will be described with reference to
FIG. 1a is a structural block diagram of a computer system for controlling an oscillator.

DETAILED DESCRIPTION

The performance of a frequency standard is judged in terms of its accuracy and stability, both of which facilitate effective time-keeping. Accuracy is a measure of how closely the time-averaged output frequency matches a conventional primary standard such as the SI hertz. Stability is a measure of how little the output frequency deviates from its mean value over time. The majority of frequency standards at the cutting edge of accuracy and stability are classified as passive, which means that they consist of a local oscillator (LO) whose signal is locked to a more stable reference, such as an atomic transition.

Frequency can be measured more precisely than most other physical quantities, and so the SI units for time, length and current are defined in terms of an atomic frequency standard: the microwave ground state hyperfine transition of Caesium 133. Locking is achieved via a closed feedback loop that uses measurements of the frequency offset between the LO and reference, to produce periodic corrections to the LO. The slaved system, a locked local oscillator (LLO), has an output that allows the performance of the reference to be effectively transferred to the tuneable LO.

Figure 1A:
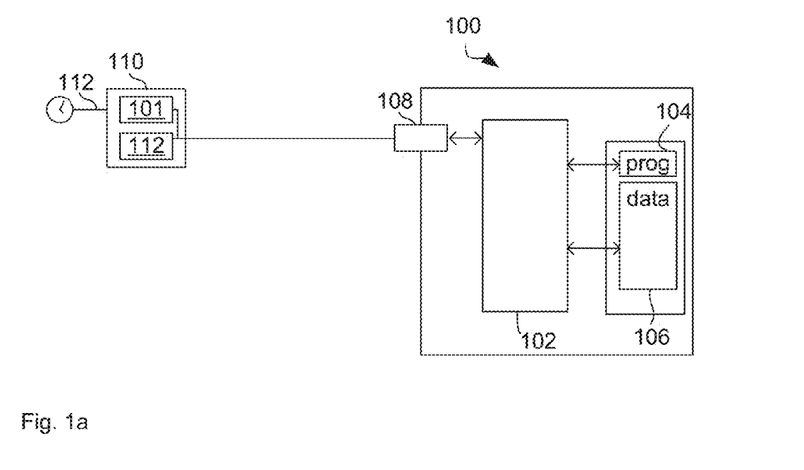
Figure 1B:
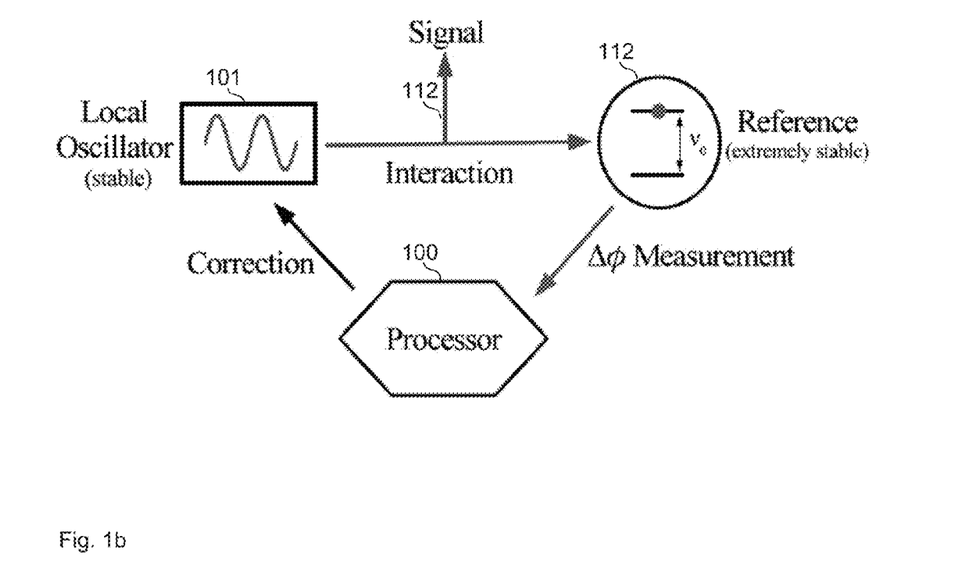
FIG. 1b is a functional diagram the controlling concept.

FIG. 1 is a structural block diagram of a computer system 100 for controlling the local oscillator 101. FIG. 1b is a functional diagram of the controlling concept. The computer system 100 comprises a processor 102 connected to a program memory 104, a data memory 106, a communication port 108 and an output port 110. The program memory 104 is a non-transitory computer readable medium, such as a hard drive, a solid state disk or CD-ROM. Software, that is, an executable program stored on program memory 104 causes the processor 102 to perform the method in FIG. 2a, that is, processor 102 determines a control value to control the oscillator 101.

The processor 102 may then store the control value on data store 106, such as on RAM or a processor register. Processor 102 may also send the determined control value via communication port 108 to the oscillator 101.

The processor 102 may receive data, such as measured error values, from data memory 106 as well as from the communications port 108. It is to be understood that any kind of data port may be used to receive data, such as a network connection, a memory interface, a pin of the chip package of processor 102, or logical ports, such as IP sockets or parameters of functions stored on program memory 104 and executed by processor 102. These parameters may be stored on data memory 106 and may be handled by-value or by-reference, that is, as a pointer, in the source code.

The processor 102 may receive data through all these interfaces, which includes memory access of volatile memory, such as cache or RAM, or non-volatile memory, such as an optical disk drive, hard disk drive, storage server or cloud storage.

It is to be understood that any receiving step may be preceded by the processor 102 determining or computing the data that is later received. For example, the processor 102 determines an error value and stores the error value in data memory 106, such as RAM or a processor register. The processor 102 then requests the data from the data memory 106, such as by providing a read signal together with a memory address. The data memory 106 provides the data as a voltage signal on a physical bit line and the processor 102 receives the error value via a memory interface.

In this example, oscillator 101 is part of an atomic clock 110, which provides a clock signal 112 based on oscillations of the oscillator 101. For example, the clock signal 112 may be a 'tick' or voltage pulse of a predetermined length which is generated each time the oscillator is in a predefined state, such as at a maximum positive amplitude of a sinusoidal oscillation.

However, other oscillators, such as oscillators providing a frequency reference for a processor in a computer system, may equally be controlled with the proposed solution.

In this example, oscillator 101 is 'locked' to a frequency reference 112. The frequency reference is an extremely accurate reference, such as an atomic transition of a Caesium atom, and the oscillator is periodically adjusted such that the frequency of the oscillator matches the frequency of the reference 112 as closely as possible.

It is noted that processor 102 may be a processor of a personal computer, laptop or any other computing device or may be a microcontroller, an application specific integrated circuit (ASIC) or field programmable gate array (FPGA) and may integrate the port 108, the program memory 104 and data memory 106 on a single chip. The computer system 100 may be integrated together with the atomic clock 110 or may be separate and even remotely connected. The details of stabilising the atomic clock will be later described with reference to FIG. 3.

In one example, computer system 100 and atomic clock 110 are installed on board a satellite of the Global Positioning System (GPS). Since GPS devices determine a current position based on the time when they receive a signal from the GPS satellite, it is important that the clock installed on board the satellite is accurate and does not change substantially in time (stable). As an illustration, the speed of light is about 300,000 km/s, which means that a clock error of 1 µs leads to a distance error of 300 m, which is considered unacceptable for most applications.

Figure 2A:
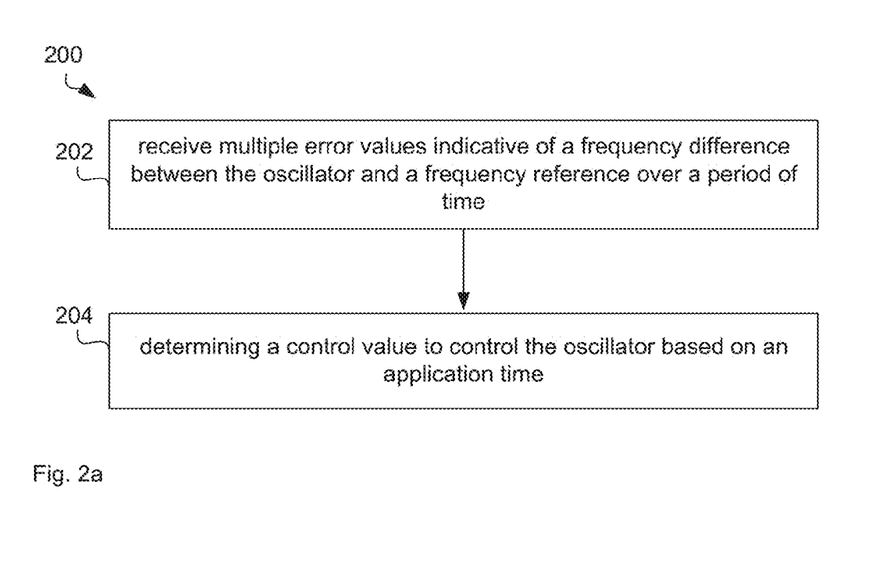
FIG. 2a illustrates a method for controlling an oscillator.

FIG. 2a illustrates a method 200 as performed by processor 102 for controlling oscillator 101. The method 200 commences by receiving 202 multiple error values indicative of a frequency difference between the oscillator and a frequency reference over a period of time. Processor 102 then determines a control value to control the oscillator 101 based on the multiple error values and based on an application time value indicative of a time of application of the control value to the oscillator 101.

For example, processor 102 solves a linear system of equations based on the multiple error values to determine multiple coefficients simultaneously as described in more detail below. Finally, processor 102 determines a control value to control the oscillator based on the multiple error values modified according to the multiple coefficients, such as by calculating a linear combination of the error values weighted by the coefficients.

Figure 2B:
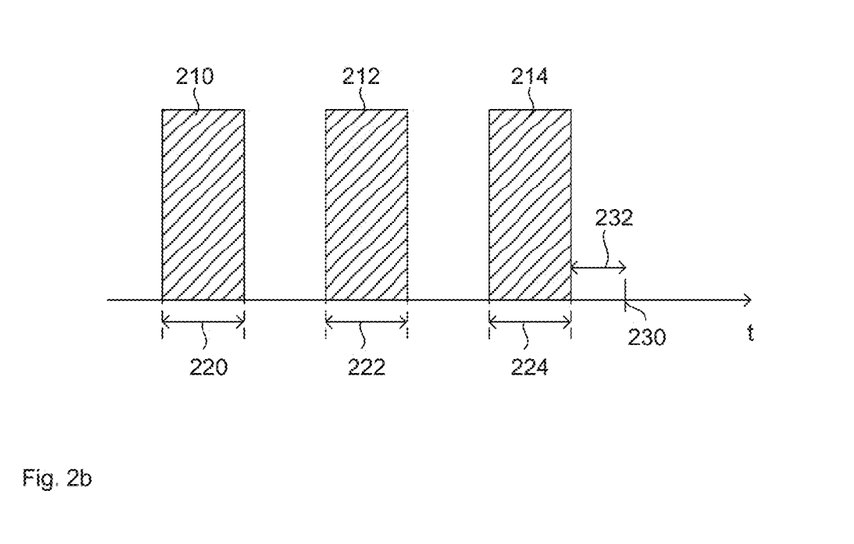
FIG. 2b is a timing diagram of multiple measurements and an application time.

FIG. 2b is a timing diagram 208 of measurements. In this example, there are three measurements 210, 212 and 214, such as Ramsey interrogations. As described further below each measurement 210, 212 and 214 measures a frequency difference between the oscillator 101 and the frequency reference 112 over a period of time 220, 222, 224, respectively. Each measurement 210, 212 and 214 results in a respective error value, such as a frequency difference in Hz or a phase difference in radians. Timing diagram 208 also shows a time of application 230 when the control value is applied to the oscillator 101. Processor 102, determines the control value based on the error values from measurements 210, 212 and 214 and based on the application time 230. As a result, processor 102 can predict the evolution of the oscillator 101 during a dead time 232 and therefore, the control is more accurate.

Figure 3:
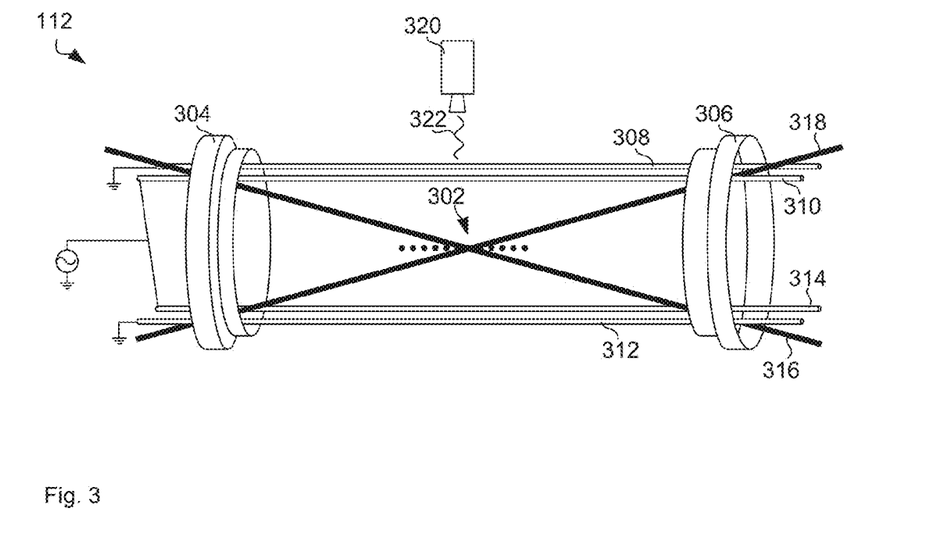
FIG. 3 illustrates an example of an atomic reference.

FIG. 3 illustrates an example of an atomic reference 112. It is noted that a wide variety of different frequency references may be used, such as trapped ions clocks using Mercury, Ytterbium or Aluminium ions, fountain clocks using neutral Caesium atoms, neutral atomic gas cell Rubidium clocks, or optical lattice clocks using Ytterbium. It is noted that generally, the oscillator is an optical oscillator, such as a laser, if the atomic transition has an optical frequency and the oscillator is a microwave oscillator, such as a cavity resonance, if the atomic transition has a microwave frequency.

In this example, atomic reference 112 is an ion trap comprising multiple Ytterbium (Yb) ions 302. Ion trap 112 comprises two electrodes 304 and 306 to axially confine the ions 302. Ion trap 112 further comprises four rods 308, 310, 312 and 314. Two diagonally opposed rods 308 and 312 are grounded while the other two rods 310 and 314 are connected to a oscillating voltage, such as a voltage of V0 cos(Ωt) with V0=150 V and Ω/2π=~0.5-20 MHz. This setup confines the ions 302 radially in a potential well. Ion trap 112 further comprises laser beams 316 and 318 to cool the ions 302. It is noted that FIG. 3 is illustrative only and therefore, the path of the beams is exaggerated and the drawing is not strictly to scale.

Figure 4:
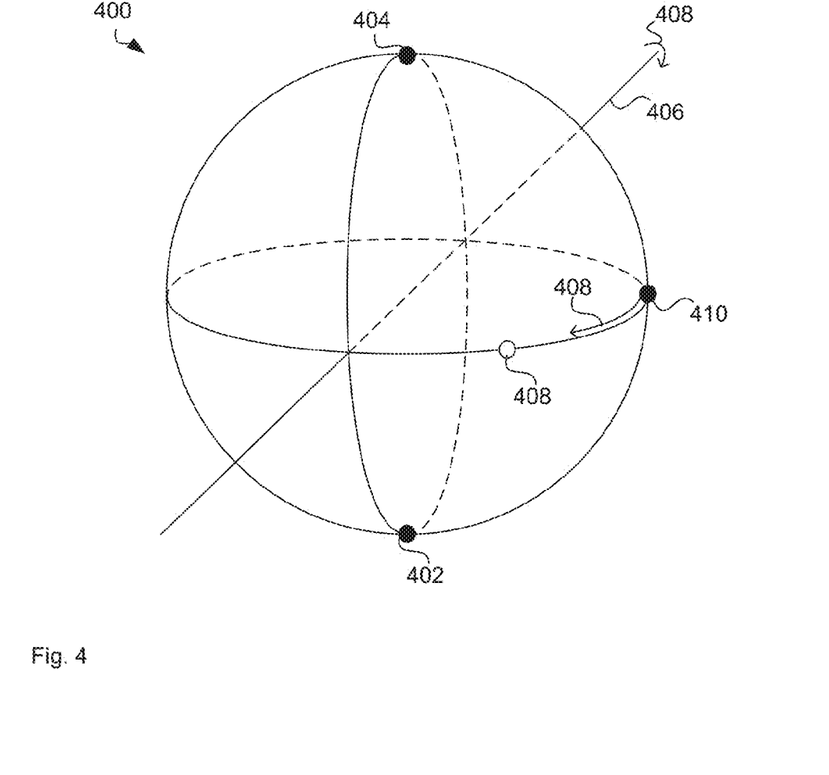
FIG. 4 is a simplified graphical representation of the quantum states in a Bloch sphere.

FIG. 4 is a simplified graphical representation of the quantum states in a Bloch sphere 400 of one of the ions 302. The Bloch sphere 400 can be representative of many different quantum coherent two-level systems. In this example, an effective two level system is realised from various transitions in atoms. In one example, hyperfine states in Ytterbium $^{171}$Yb$^+$ are used where the clock transition is from |F=0, $m_F$=0> to |F=1, $m_F$=0> and occurs at ~12.6 GHz. In another example, the ions are $^{199}$Hg$^+$ ions and Bloch sphere 400 comprises a ground state 402, such as the $^2S_{1/2}$, F=0 level and an exited state 404, such as the $^2D_{5/2}$, F=2, $m_F$=0 level. Alternatively, one can relate to the Cs manifold, which has a ~9.19 GHz transition. Lasers 316 and 318 pump the ions 302 into excited state 404.

What follows is a simplified description of a process that is also referred to as Ramsey interrogation. The lasers 316 and 318 are turned off and a microwave horn or other waveguide 320 applies an electromagnetic field 322 according to oscillations of oscillator 101 to the ions 302 for a predetermined period of time and a predetermined amplitude to perform a π/2 rotation in the Bloch sphere around an axis 406 as indicated by arrow 408. In the case of an optical transition the oscillator output may be in the form of a laser beam. The result is a superposition state 410 where the ground state 402 and the excited state 404 have equal probabilities if a measurement was made. As a result, the state 410 rotates along the equator of Bloch sphere 400 as indicated by arrow 408.

One entire rotation along the equator until the state arrives back at superposition state 410 exactly represents the period of the transition between the ground state 402 and the exited state 404. In other words, if the oscillator 101 is perfectly tuned to this frequency, the rotation of state 410 is synchronised with the frequency of the oscillator 101. For example, each time the sine wave of oscillator 101 is at its positive maximum, the state of the ions 302 is exactly at superposition state 410.

The horn 320 is re-activated and as a result the state 410 is again rotated by π/2 around axis 406 and therefore arrives at the ground state 402. The laser 316 and 318 can then be modulated to a fluorescing frequency of ground state 402 such that only ions which are in that ground state emit photons that can then be detected. In the case of perfect synchronisation, all ions have high probability of emitting photons, which leads to a high detection signal.

However, the oscillator 101 may not be perfectly accurate and therefore, the frequency of the oscillator 101 may deviate from the frequency of the reference 112. As a result, when the second π/2 rotation is applied to the ions 302, the ions will not exactly be in state 410. For example, if the frequency of oscillator 112 is slightly higher that the reference, the ions are in state 408. However, the second π/2 rotation is still around axis 406 and therefore, the resulting state is not ground state 402. As a result, when the states of the ions are measured, not all ions collapse to the ground state 402 and therefore, not all ions show fluorescence, which leads to a lower detection signal as in the perfectly synchronised case above.

This lower detection signal can then be used as a measure of frequency error between the oscillator 101 and the frequency reference 112. An error value may be derived as the number of detected photons, for example, or a difference to the maximum number of detected photons.

The time between the π/2 rotations can be chosen arbitrarily, while a longer time between the π/2 rotations generally leads to a narrower bandwidth of the output frequency because the difference between the mixed state 410 and the deviated state 408 grows over time. The interrogation time is chosen such that the phase evolution due to an error in oscillator 101 does not exceed a full 2π rotation, and any expected deviation in the fluorescence signal is measurable on the timescale of the evolution.

The measurement is performed sequentially for different periods of time with equal or varying length, that is, the measurements are not performed at the same time but at different times. Processor 102 receives the error values for each of the respective measurements. Each error value represents the error of the oscillator and therefore, processor 102 determines a control signal to control the oscillator 112, such as by changing the geometry of an oscillating cavity or electrically tuning a resonant circuit.

It is noted here that a value indicative of a measurement of a frequency difference may be the frequency difference itself or a value derived from the frequency difference, such as a normalised frequency difference. It may also be the frequency difference derived from a more complex protocol such as square-wave frequency modulation. A corresponding interpretation is to be applied to similar terms, such as a value indicative of a time may be an absolute time value, a relative time value or an integer number of clock periods, for example.

Disclosed herein is an approach to precision frequency standard characterization and stabilization, providing performance enhancements in the presence of non-Markovian noise in the LO 101 with "software-only" modifications. Further disclosed is a theoretical framework casting various measures for frequency standard variance in terms of frequency-domain transfer functions, incorporating the effects of feedback stabilization via a chain of Ramsey measurements. The result of these Ramsey measurements are also referred to as error values indicative of a frequency difference between the LO 101 and the frequency reference.

Using this framework a, processor 102 performs an optimized hybrid feedforward measurement protocol which employs results from multiple measurements and transfer-function-based calculations of measurement covariance to provide improved corrections in the feedback loop. This approach fundamentally exploits the non-Markovian nature of typical LO power spectra, using correlations to provide high-accuracy corrections in the presence of uncompensated dead time. The proposed methods and systems have benefits in both correction accuracy and long-term oscillator stability using hybrid feedforward.

Instabilities in atomic clocks may be partially compensated through use of a feedback protocol designed to transfer the stability of the reference to the LO. LO fluctuations ultimately produce instabilities in the locked local oscillator (LLO) due to both uncompensated noise during initialization and readout stages of the measurement cycle (dead time), as well as phenomena such as aliasing of noise at harmonics of the feedback-loop period, known as the Dick effect.

In this disclosure we demonstrate a method by which both the accuracy and stability of passive frequency standards can be improved without the need for hardware modification. We present a framework capturing the effects of LO noise and feedback protocols in the frequency domain in order to calculate the expected correlations between multiple sequential measurements. Thus, given statistical knowledge of the LO noise characteristics, processor 102 is able to produce a new form of hybrid feedforward stabilization incorporating the results of an arbitrary number of past measurements with variable duration to calculate an improved correction to the LO.

In cases where dead time is significant and there is substantial uncompensated LO evolution, we show that this approach allows corrections with improved accuracy to be applied to the frequency standard. Numerical simulations also demonstrate that long-term stability of the LLO is improved through a moving-average correction scheme, where corrections are made based on weighting values determined analytically in the same hybrid feedforward approach. The method described here is a technology-independent software-oriented approach performed by processor 102 to improving the performance of frequency standards.

Figure 5A:
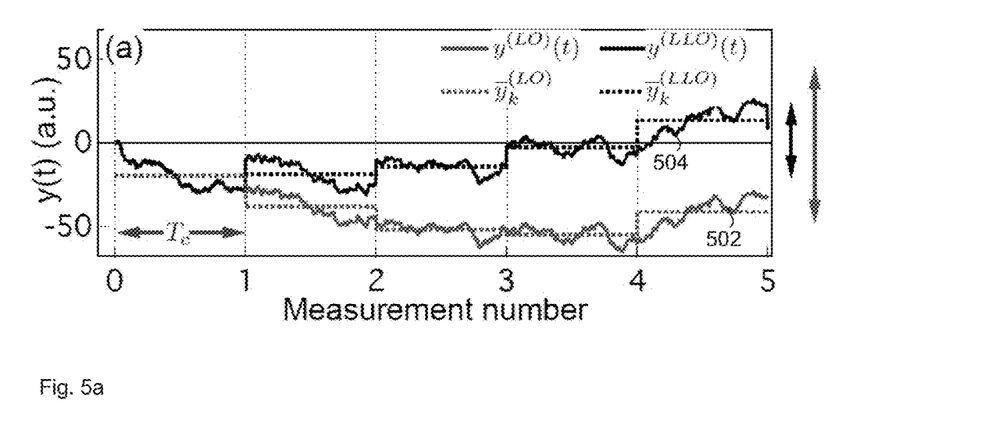
FIG. 5a illustrates simulated traces for a noisy oscillator.

FIG. 5a illustrates simulated traces for a noisy LO, unlocked 502 and locked with traditional feedback 504, with correction period $T_c$. The dotted horizontal bars indicate the measurement outcomes (samples) over each cycle, which are applied as correction at the end of the cycle (assuming zero dead time). The arrows on the far right schematically indicate how locking reduces the variance of y(t) though it does not eliminate it.

Figure 5B:
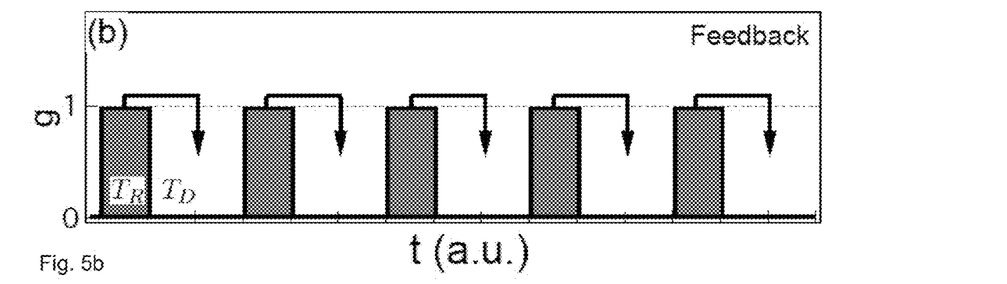
FIG. 5b is a schematic timing diagram of a feedback protocol.

FIG. 5b is a schematic timing diagram of a feedback protocol with Ramsey measurement time, $T_R$ and dead time $T_D$, where $T_D+T_R=T_c$. The Ramsey measurement time $T_R$ is also referred to as Ramsey period or more generally as period of time over which a frequency difference is measured to determine an error value between the oscillator and the frequency reference.

Figure 5C:
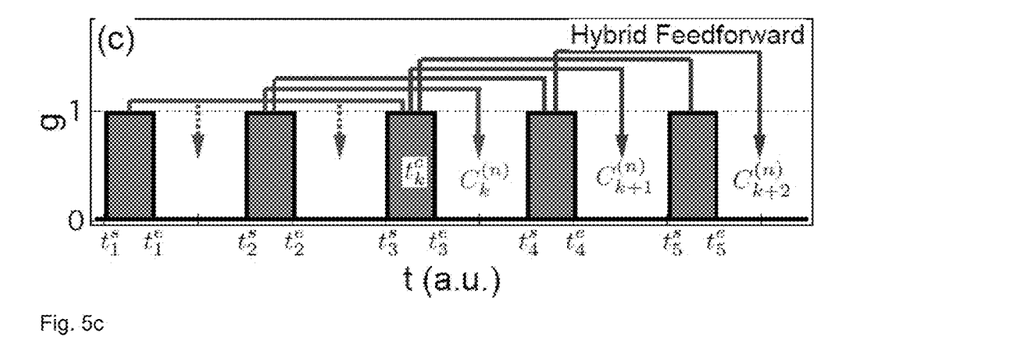
FIG. 5c is a schematic diagram of hybrid feedforward.

FIG. 5c is a schematic diagram of hybrid feedforward with an example protocol with n=3 non-uniform-duration measurements. Corrections $C_k^{(n=3)}$ are applied in either non-overlapping blocks of three measurements or as a moving average (depicted here). In the latter case, processor 102 recalculates the covariance matrix to correctly account for any variations in measurement duration. Dashed arrows indicate the first corrections performed without full calculation of the covariance matrix. This effect vanishes for k>n.

Ramsey spectroscopy provides a means to determine the average fractional frequency offset over a period, $T_R$; this information is used to determine the correction to be applied in the standard LO feedback loop as shown in FIG. 5a. We represent the fractional frequency offset of an LO relative to an ontologically perfect (atomic) reference $y(t) \equiv (v(t)-v_0)/v_0$, where $v_0$ is the reference frequency and v(t) is the LO frequency. A Ramsey measurement performed over the k th time interval $[t_k^s, t_k^e]$, with duration $T_R^{(k)} \equiv t_k^e - t_k^s$, is characterized by a sensitivity function $g(t) \in [0,1]$, capturing the extent to which LO fluctuations at some instant t contribute to the measured outcome for that interval, yielding measurement outcome $$\bar{y}_k = \frac{1}{T_R^{(k)}} \int_{t_k^s}^{t_k^e} y(t)g(t-t_k^s)\,dt.$$

In the case of a square sensitivity function over the Ramsey period, the form of $\bar{y}_k$ reduces to the time-average of y(t) over the interval $[t_k^s, t_k^e]$.

The performance of the frequency standard is statistically characterized, for instance, by the time-domain sample variance $$\sigma_y^2[N] = \frac{1}{N-1} \sum_{k=1}^{N} \left(\bar{y}_k - \frac{1}{N}\sum_{l=1}^{N} \bar{y}_l\right)^2$$

for N sequential finite-duration measurements $\{\bar{y}_k\}$ [2]. This metric captures the evolution of LO frequency as a function of time. Similarly we may define the true variance of $\bar{y}_k$, $\sigma_y^2(k) = E[\bar{y}_k^2]$, equal to the expected value of $\bar{y}_k^2$, since y(t) is assumed to be a zero-mean process. The true variance captures the spread of measurement outcomes due to different noise realizations in a single timestep. Applying feedback corrections sequentially after measurements is able to effectively reduce y(t) over many cycles, improving long-term stability; whether the sample or the true variance is used, larger variance corresponds to a frequency standard with greater fractional uncertainty (worse performance).

Despite the power of feedback stabilization, evolution of y(t) during a measurement period, $T_c$ can cause frequency deviations that are uncompensated in the feedback loop, limiting the accuracy of the corrections and increasing the statistical variance of the locked frequency standard. These effects are exacerbated in circumstances where dead time, $T_D$, is substantial, due, for instance, to the need to reinitialize the reference between measurements (FIG. 5b).

We propose an efficient computational framework in which to capture these effects, and hence transition to the frequency domain, making use of the power spectral density of the LO, $S_y(\omega)$, in order to characterize average performance over a hypothetical statistical ensemble. In this description residual LLO instability persists because the feedback is insensitive to high-frequency LO noise relative to the loop bandwidth acting during both measurement and dead time. Additional instability due to the Dick effect comes from aliasing of noise at harmonics of the loop bandwidth.

We may calculate the effects of measurement, dead-time, and the feedback protocol itself on frequency standard performance in the frequency domain as follows. Defining a normalised, time-reversed sensitivity function $\bar{g}(t_k^m-t)=g(t-t_k^s)/T_R^{(k)}$, where g(t) is assumed to be time-reversal symmetric about $t_k^m$, the midpoint of $[t_k^s,t_k^e]$, we can express, for instance, the true variance as a convolution $\sigma_y^2(k)=E[(\int_{-\infty}^{\infty} y(t)\bar{g}(t_k^m-t)dt)^2]$. Expanding this expression and using the Wiener-Khinchin theorem gives the true variance of measurement outcomes as an overlap integral $$\sigma_y^2(k) = \frac{1}{2\pi} \int_0^\infty S_y(\omega)|G_k(\omega)|^2\,d\omega,$$

with $G_k(\omega) \equiv \int_{-\infty}^{\infty} \bar{g}(t_k^m-t)e^{i\omega t}dt$. Here $|G_k(\omega)|^2$ is called the transfer function for the k th sample. For measurements performed using Ramsey interrogation with $\pi/2$ pulses of negligible duration and zero dead time, the transfer function has a sinc-squared analytic form $|G_k(\omega)|^2=(\sin(\omega T_R^{(k)}/2)/(\omega T_R^{(k)}/2))^2$.

We thus see that this approach allows expression of time-domain LO variances as overlap integrals between $S_y(\omega)$ and the transfer function, $|G(\omega)|^2$, capturing the effects of the measurement and feedback protocol. Through this formalism we may calculate analytic expressions for measures such as the true variance, sample variance and Allan variance for either free-running LOs or LLOs undergoing feedback stabilization, and permits incorporation of arbitrary measurement protocols (e.g. arbitrary and dynamic Ramsey periods and dead times).

This approach is powerful because it may also be employed by processor 102 to determine new measurement feedback protocols designed to improve the performance of the LLO. In particular, one aim is to mitigate the deleterious effect of dead time on LLO accuracy and stability by combining information from multiple measurements with statistical information about LO noise, $S_y(\omega)$. A key insight is that the non-Markovianity of dominant noise processes in typical LOs—captured through the low-frequency bias in $S_y(\omega)$—implies the presence of temporal correlations in y(t) that may be exploited by processor 102 to improve the performance of a feedback loop.

Processor 102 may determine a frequency-domain measure of correlation between time-separated measurements, using transfer functions derived here. In summary, processor 102 calculates a correlation measure, such as a covariance matrix, in the frequency domain via transfer functions to capture the relative correlations between sequential measurement outcomes of a LLO, and use this matrix to derive a linear predictor of the noise at the moment of correction.

This predictor provides a correction with higher accuracy than that derived from a single measurement for experimentally-relevant noise spectra, allowing the processor 102 to improve the performance of the LLO. Since the predictor is found using information from previous measurements (feedback) and a priori statistical knowledge of the LO noise (feedforward), we call the scheme hybrid feedforward. Effectively, the ability to predict the evolution of y(t) by exploiting correlations captured statistically in $S_y(\omega)$ allows feedback stabilization with increased accuracy and reduced sensitivity to dead time.

In hybrid feedforward, processor 102 linearly combines results from a set of n past measurements with weighting coefficients $c_k$ optimized such that the k th correction, $C_k$, provides maximum correlation to $y(t_k^c)$ at the instant of correction $t_k^c$ (FIG. 5c). This variable $t_k^c$ is also referred to as an application time value indicative of a time of application of the control value to the oscillator. Assuming that the LO noise is Gaussian, the optimal least minimum mean squares estimator (MMSE) is linear, and the optimal control value of $C_k = c_k \cdot \bar{y}_k$ to control the oscillator 101: the dot product of a set of correlation coefficients $c_k$ derived by processor 102 based on stored values of $S_y(\omega)$ and a set of n past measured error values, $\bar{y}_k = \{\bar{y}_{k,1}, \ldots, \bar{y}_{k,n}\}$.

Processor 102 stores an (n+1)×(n+1) covariance matrix on data store 106 where the (n+1) th term represents an ideal zero-duration sample at $t_k^c$. The covariance matrix may be written in block form:

$$\sum_k \equiv \begin{bmatrix} \sigma(\bar{y}_{k,1}, \bar{y}_{k,1}) & \ldots & \sigma(\bar{y}_{k,1}, y(t_k^c)) \\ \sigma(\bar{y}_{k,2}, \bar{y}_{k,1}) & \ldots & \sigma(\bar{y}_{k,2}, y(t_k^c)) \\ \ldots & \ldots & \ldots \\ \sigma(y(t_k^c), \bar{y}_{k,1}) & \ldots & \sigma(y(t_k^c), y(t_k^c)) \end{bmatrix} \quad (1)$$

$$\equiv \begin{bmatrix} M_k & F_k \\ F_k^T & \sigma(y(t_k^c), y(t_k^c)) \end{bmatrix}. \quad (2)$$

The MMSE optimality condition is then fulfilled for $$c_k = \frac{F_k}{\sqrt{F_k^T M_k F_k}} \frac{w_k}{2\pi} \int_0^\infty S_y(\omega) d\omega \quad (3)$$

where $w_k$ is an overall correction gain.

Processor 102 calculates equation (3) to determine the coefficients $c_k$, which the processor then uses as weights to calculate a weighted sum of past measurements of error values indicative of a frequency difference between the oscillator and the frequency reference over a period of time according to the Ramsey interrogation principle.

Processor 102 may calculate the covariance matrix elements as a spectral overlap $$\sigma(\bar{y}_k, \bar{y}_l) = \frac{1}{2\pi} \quad (4)$$

$\int_0^\infty S_y(\omega) G_{k,l}^2(\omega) d\omega$ using a pair covariance transfer function $$G_{k,l}^{(2)}(\omega) = \left(\omega^2 T_R^{(k)} T_R^{(l)}\right)^{-1} [\cos(\omega(t_l^s - t_k^s)) + \cos(\omega(t_l^e - t_k^e)) - \cos(\omega(t_l^f - t_k^s)) - \cos(\omega(t_l^s - t_k^e))]$$

in the case of arbitrary-length Ramsey interrogations over the intervals $[t_{k,l}^s, t_{k,l}^e]$. This allows effective estimation of y(t) for any t and for any set of measured samples $\bar{y}_k$.

In the practical setting of a frequency standard system, such as an atomic clock, processor 102 may improve both the accuracy of each correction, by maximising the correlation between the control value $C_k$ and the predicted error value $y(t_k^c)$, and the long-term stability of the LLO output, captured by the metrics of frequency variance, sample variance, and Allan variance.

In order to test the general performance of hybrid feedforward in different regimes processor 102 may perform numerical simulations of noisy LOs with user-defined statistical properties, characterized by $S_y(\omega)$. We produce a fixed number of LO realizations in the time domain and then use these to calculate measures such as the sample variance over a sequence of "measurement" outcomes with user-defined Ramsey measurement times, dead times, and the like. In these calculations we may assume that the LO is free running, experiencing standard feedback, or employing hybrid feedforward, and then take an ensemble average over LO noise realizations. Our calculations include various noise power spectra, with tuneable high-frequency cutoffs, including common 'flicker frequency' ($S_y(\omega) \propto 1/\omega$), and 'random walk frequency' ($S_y(\omega) \propto 1/\omega^2$) noise, as appropriate for experiments incorporating realistic LOs.

Figure 6A:
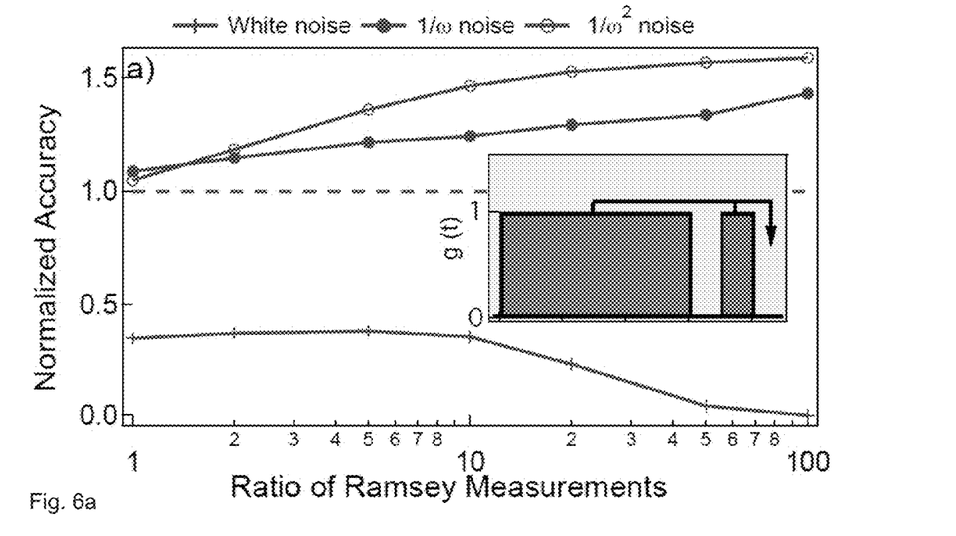
FIG. 6a shows the calculated accuracy of the first correction for hybrid feedforward.

FIG. 6a shows the calculated accuracy of the first correction for hybrid feedforward under different forms of $S_y(\omega)$ as a function of the ratio of Ramsey periods between the two measurements employed in constructing $C_k^{(2)}$. Accuracy for hybrid feedforward is normalized to feedback (accuracy=1). Inset: depiction of the form of $C_k^{(2)}$ used in hybrid feedforward.

Figure 6B:
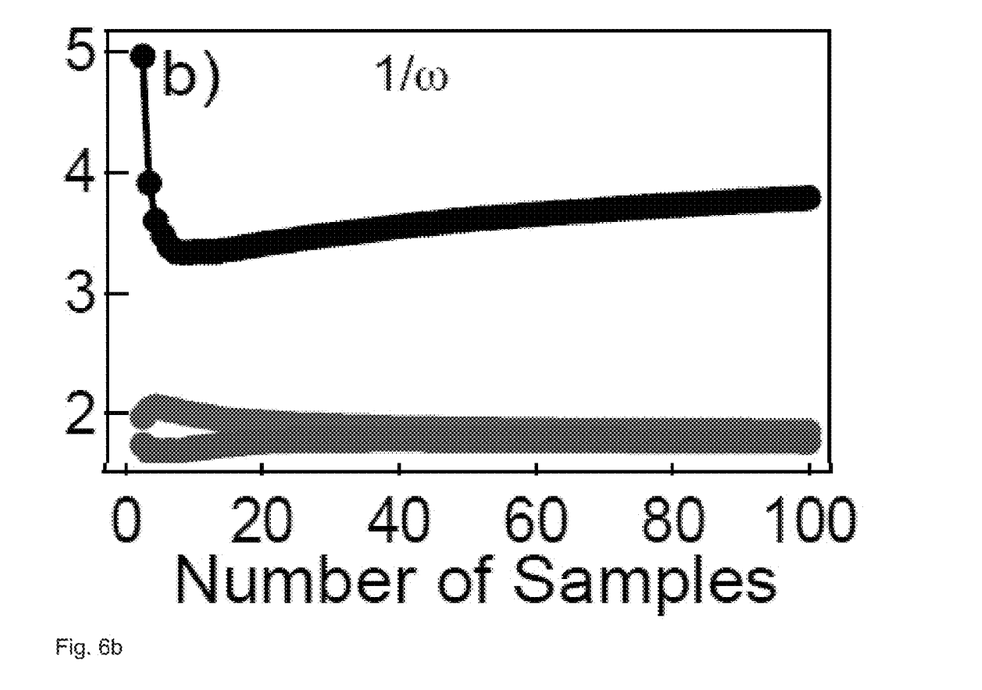
FIG. 6b shows the calculated sample variance for a free-running oscillator.
Figure 6C:
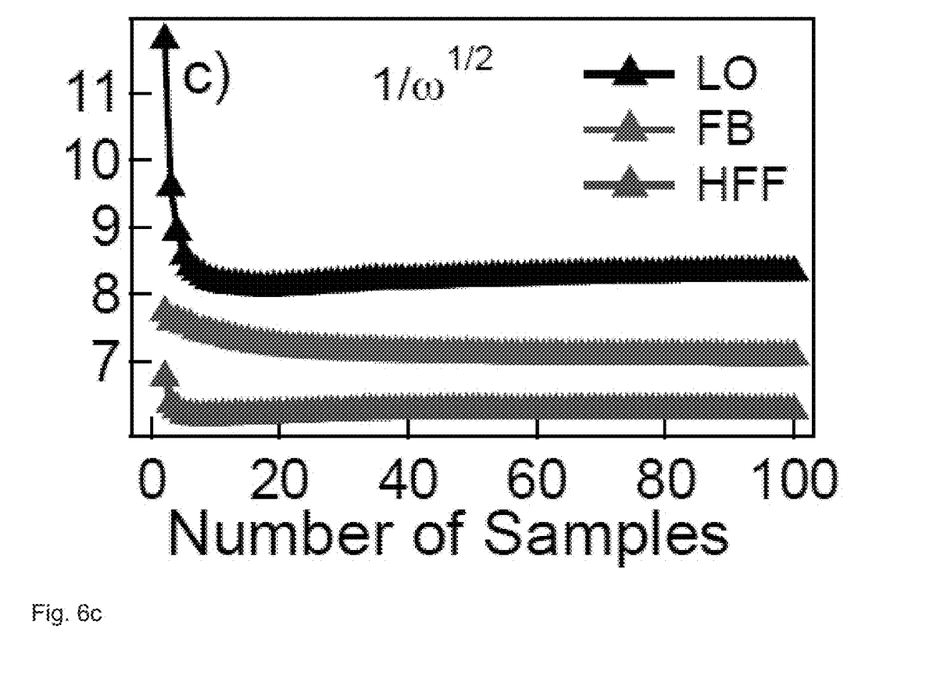
FIG. 6c shows the calculated sample variance for free-running oscillator.

FIG. 6b shows the calculated sample variance for free-running LO, standard feedback, and hybrid feedforward assuming $S_y(\omega) \propto 1/\omega$, $\omega_c/2\pi = 100/T_c$ and $S_y(\omega) \propto 1/\omega^{1/2}$ with a cutoff frequency $\omega_c/2\pi = 1/T_c$ FIG. 6c shows the calculated sample variance for free-running LO as a function of measurement number, N. PSDs with different $\omega$-dependences are normalised to have the same value at $\omega_{low} = 1/100T$. Hybrid feedforward assumes n=2.

Figure 6D:
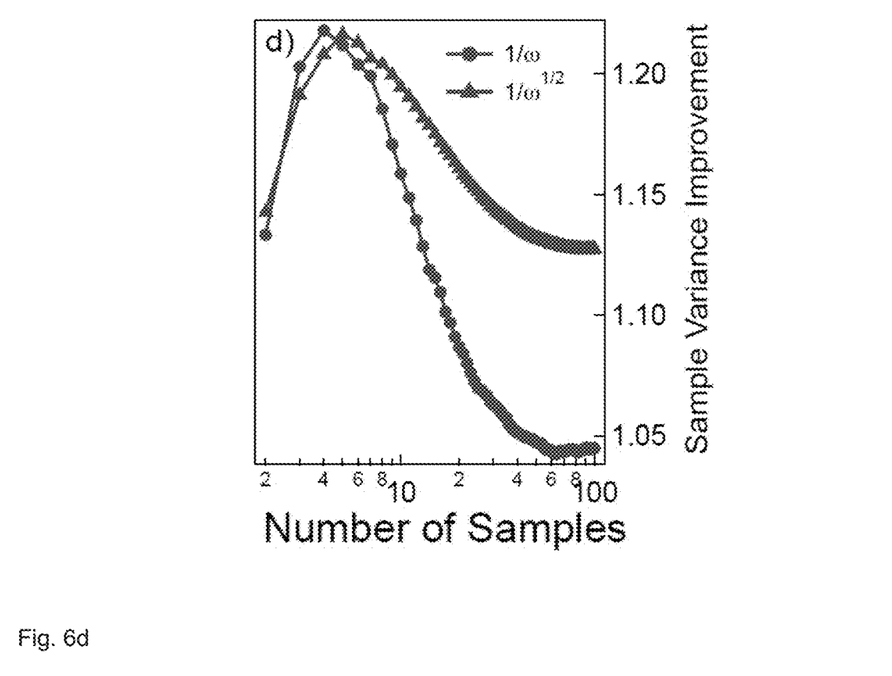
FIG. 6d shows normalized performance gains for hybrid feedforward.

FIG. 6d shows normalized performance gains for hybrid feedforward relative to standard feedback. As can be seen from FIG. 6b, sample variance for the free-running LO diverges with N due to low-frequency content of the normalized performance shown in FIG. 6d.

Figure 6E:
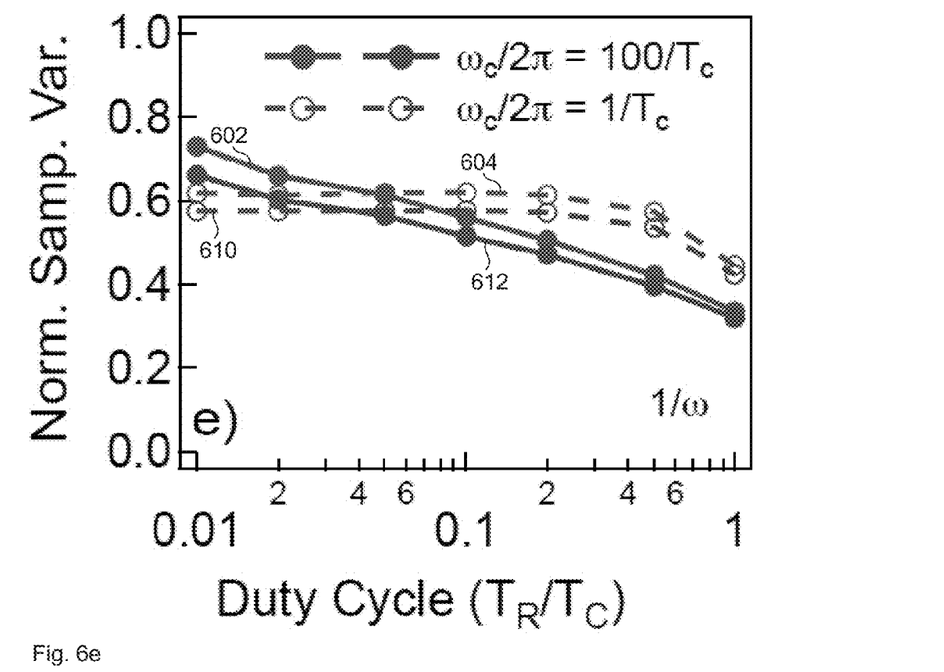
FIGS. 6e and 6f show calculated $\langle \sigma_y^2[N] \rangle$ for N=20 as a function of duty factor.
Figure 6F:
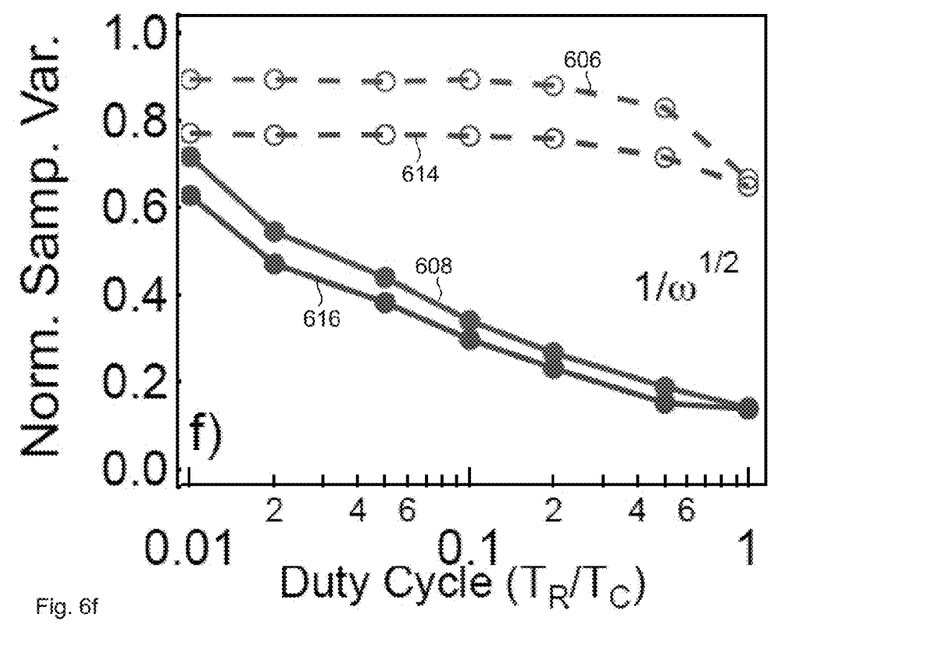

FIGS. 6e and 6f show calculated $\langle \sigma_y^2[N] \rangle$ for N=20 as a function of duty factor. Feedback 602, 604, 606 and 608 and feedforward 610, 612, 614 and 616.

Processor 102 may achieve improvement in correction accuracy associated with a single correction cycle, defined as the extent to which a correction brings $y^{LLO}(t) \to 0$ at the instant of correction, $t = t_k^c$. We define a metric for accuracy as the inverse of frequency variance at $t_k^c$ relative to the free-running LO, $$A_k \equiv \frac{\langle y^{LO}(t_k^c)^2 \rangle}{\langle y^{LLO}(t_k^c)^2 \rangle}.$$

Closed form analytic expressions for correction accuracy may be calculated in terms of elements of the covariance matrix (see below).

Tunability in the hybrid feedforward protocol comes from the number of measurements to be combined, n, in determining $\{C_k\}$ as well as the selected Ramsey periods, permitting an operator to sample different parts of $S_y(\omega)$. In one example, processor 102 considers n=2 sequential measurements and varies the Ramsey durations as optimization parameters.

Processor 102 may perform a Nelder-Mead simplex optimization over the measurement durations to find that a hybrid feedforward protocol consisting of a long measurement period followed by a short period maximizes feedforward accuracy (FIG. 6a).

This structure ensures that low-frequency components of $S_y(\omega)$ are sampled but the measurement sampling the highest frequency noise contributions are maximally correlated with $y(t_k^c)$. With $S_y(\omega) \propto 1/\omega$ and $S_y(\omega) \propto 1/\omega^2$ processor 102 may achieve increased accuracy under hybrid feedforward while the rapid fluctuations in y(t) arising from a white power spectrum mitigate the benefits of hybrid feedforward. In one example, correction accuracy is maximized for n=2-3, with diminishing performance for larger n.

In some slaved frequency standards processor 102 relies on repeated measurements and corrections to provide long-term stability, a measure of how the output frequency of the LLO deviates from its mean value over time.

We study this by calculating the sample variance of a time-sequence of measurement outcomes averaged over an ensemble of noise realizations, $\langle \sigma_y^2[N] \rangle$. A "moving average" style of hybrid feedforward provides improved long-term stability, as the correction $C_k$ will depend on the set of measurement outcomes $\bar{y}_k = \{\bar{y}_{k-n+1}, \ldots, \bar{y}_k\}$, among which previous corrections have been interleaved, as illustrated in FIG. 5c.

FIGS. 6a to 6d demonstrate the resulting $\langle \sigma_y^2[N] \rangle$ up to N=100 measurements, calculated using feedback and hybrid feedforward with n=2, and assuming uniform $T_R$. We observe clear improvement (reduction) in $\langle \sigma_y^2[N] \rangle$ through the hybrid feedforward approach, with benefits of order 5-25% of $\langle \sigma_y^2[N] \rangle$ relative performance improvement over standard measurement feedback. We present data for different functional forms of $S_y(\omega)$, including low-frequency dominated flicker noise ($\propto 1/\omega$), and power spectra ($\propto 1/\omega^{1/2}$) with more significant noise near $T_c^{-1}$. In one example, the benefits achieved by processor 102 are most significant in the long term when high-frequency noise reduces the efficacy of standard feedback.

In one example, the improvement provided by hybrid feedforward is most marked for low duty factor d, defined as the ratio of the interrogation time to total cycle time: $d = T_R/T_c$. As $d \to 1$ we observe that the feedback and hybrid feedforward approaches converge, as standard feedback corrections become most effective when dead-time is shortest. However as the dead-time increases, feedback efficacy diminishes until $\langle \sigma_y^2[N] \rangle$ for the feedback-locked LO approaches that for the free-running LO (value unity in FIGS. 6e-f). In this limit the utility of the measurements diminishes as the LO noise evolves substantially during the dead-time, but even here knowledge of correlations in the noise allows processor 102 to provide significant gains in stability. Exact performance depends sensitively on the form and magnitude of $S_y(\omega)$, but qualitatively demonstrates that the systems where higher-frequency noise components: $T_c^{-1}$ are present benefit from hybrid feedforward.

In summary, disclosed is a set of analytical tools describing LLO performance in the frequency domain for arbitrary measurement times, durations, and duty cycles. These generalized transfer-functions facilitate a software approach to LO feedback stabilization in slaved passive frequency standards. This technique as performed by processor 102 leverages a series of past measurements and statistical knowledge of the noise to improve the accuracy of feedback corrections and ultimately improve the stability of the slaved LO.

In one example, processor 102 achieves improved correction accuracy using nonuniform-duration $T_R$ over a cycle, as well as long-term stability improvement using only the simplest case of uniform $T_R$. These approaches may be combined to produce LLOs with improved accuracy at the time of correction and improved long-term stability. In cases where the penalty associated with increasing $T_R$ is modest (lower high-frequency cutoff), such composite schemes can provide substantial benefits as well, improving both frequency standard accuracy and stability.

Other expansions may leverage the basic analytic formalism. Processor 102 uses the transfer functions, $|G(\omega)|^2$ and $G_{k,l}^2(\omega)$, and may assume only the simplest form for the time-domain sensitivity function and fixed overall gain. However, processor 102 may use a measurement protocol to yield $|G(\omega)|^2$ that suppresses the dominant spectral features of the LO noise. Through such an approach processor 102 may reduce the impact of aliasing on clock stabilization, providing a path towards reduction of the so-called Dick limit in precision frequency references.

In some examples, the relative performance benefits of the hybrid feedforward approach are of metrological significance—especially considering they may be gained using only "software" modification without the need for wholesale changes to the clock hardware. The approach may find special significance in tight-SWAP applications such as space-based clocks where improving the LO quality is difficult due to system-level limitations.

Frequency-Domain Variance Expressions for General Measurement Windows

Point-like realisations of the stochastic process y(t) are difficult to be obtained experimentally. Instead, the LO frequency error can be measured by a method that produces integrated samples, denoted $\bar{y}_k$ and indexed in time by k:

$$\bar{y}_k \equiv \frac{1}{T_R^{(k)}} \int_{t_k^s}^{t_k^e} y(t) g(t - t_k^s) dt \quad (5)$$

where $T_R^{(k)} \equiv t_k^e - t_k^s$, $[t_k^s, t_k^e]$ is the time interval over which the k th sample is taken, and g(t) is a sensitivity function capturing the extent to which LO fluctuations at some instant t contribute to the measured outcome for that sample. The range of g(t) is [0,1] and its domain is $t \in [0, T_R^{(k)}]$. The ideal case is the rectangular window case, where $$g(t) = \begin{cases} 1 & \text{for } t \in [0, T_R^{(k)}] \\ 0 & \text{otherwise} \end{cases} \quad (6)$$

in which case $\bar{y}_k$ reduces to the time-average of y(t) over the interval $[t_k^s, t_k^e]$. The variance of $\bar{y}_k$, denoted $\sigma_y^2(k)$ and often called true variance [2], is equal to the expected value of $\bar{y}_k^2$, since y(t) is assumed to be a zero-mean process:

$$\sigma_y^2(k) = E[\bar{y}_k^2] \tag{7}$$

$$= E\left[\left(\frac{1}{T_R^{(k)}} \int_{t_k^s}^{t_k^e} y(t) g(t - t_k^s) dt\right)^2\right] \tag{8}$$

Defining a normalised, time-reversed sensitivity function $\bar{g}(t_k^m - t) = g(t - t_k^s)/T_R^{(k)}$, where g(t) is assumed to be time-reversal symmetric about $t_k^m$, the midpoint of $[t_k^s, t_k^e]$, we can express the integral as a convolution:

$$\sigma_y^2(k) = E[(\int_{-\infty}^{\infty} y(t) \bar{g}(t_k^m - t) dt)^2] \tag{9}$$

Expanding this expression gives $$\sigma_y^2(k) = E[\int_{-\infty}^{\infty} y(t) \bar{g}(t_k^m - t) dt \int_{-\infty}^{\infty} y(t') \bar{g}(t_k^m - t') dt'] \tag{10}$$

$$= \int_{-\infty}^{\infty} \int_{-\infty}^{\infty} E[y(t)y(t')] \bar{g}(t_k^m - t) \bar{g}(t_k^m - t') dt' dt \tag{11}$$

$$= \int_{-\infty}^{\infty} \int_{-\infty}^{\infty} R_{yy}^{TS}(\Delta t) \bar{g}(t_k^m - t) \bar{g}(t_k^m - t') dt' dt \tag{12}$$

where $R_{yy}^{TS}(\Delta t)$ is the two-sided autocorrelation function and $\Delta t \equiv t' - t$. Substituting the Wiener-Khinchin result $R_{yy}^{TS}(\Delta t) = F^{-1}\{S_{yy}^{TS}(\omega)\}$ gives $$\sigma_y^2(k) = \int_{-\infty}^{\infty} \int_{-\infty}^{\infty} \left(\frac{1}{2\pi} \int_{-\infty}^{\infty} S_{yy}^{TS}(\omega) e^{i\omega(t'-t)} d\omega\right) \times \tag{13}$$

$$\bar{g}(t_k^m - t) \bar{g}(t_k^m - t') dt' dt \tag{14}$$

Defining the Fourier transform of $\bar{g}(t_k^m - t)$:

$$G_k(\omega) \equiv \int_{-\infty}^{\infty} \bar{g}(t_k^m - t) e^{i\omega t} dt \tag{15}$$

and substituting it into the above expression for $\sigma_y^2(k)$ gives $$\sigma_y^2(k) = \frac{1}{2\pi} \int_{-\infty}^{\infty} S_{yy}^{TS}(\omega) G_k(\omega) G_k^*(\omega) d\omega \tag{16}$$

$$= \frac{1}{2\pi} \int_{-\infty}^{\infty} S_{yy}^{TS}(\omega) |G_k(\omega)|^2 d\omega \tag{17}$$

$$= \frac{1}{2\pi} \int_{0}^{\infty} S_y(\omega) |G_k(\omega)|^2 d\omega \tag{18}$$

where $|G_k(\omega)|^2$ is called the transfer function for the k th sample. The substitution of the one-sided PSD $S_y(\omega)$ for the two-sided PSD $S_{yy}^{TS}(\omega)$ is possible because $|G_k(\omega)|^2$ is even. This result is similar to the convolution theorem, which states that $F\{f \ast g\} = F\{f\} \cdot F\{g\}$, where å denotes a convolution and f and g are Fourier-invertible functions.

The Allan variance, the conventional measure of frequency standard instability, can be expressed analogously $${}^A\sigma_y^2(y) = \frac{1}{2\pi} \int_0^{\infty} S_y(\omega) |{}^A G(\omega)|^2 d\omega \tag{19}$$

where the transfer function, for ideal Ramsey interrogation, is $$|{}^A G(\omega)|^2 = \frac{2\sin^4(\omega T_R/2)}{(\omega T_R/2)^2} \tag{20}$$

where $T_R$ lacks an index because the definition of the Allan variance assumes equal-duration interrogation bins [2]. The Allan variance calculated via this frequency-domain approach can be compared to its value via the time-domain approach, which consists of finding the variance of the difference between consecutive pairs of measurement outcomes:

$${}^A\sigma_y^2(y) = \frac{1}{2} \langle (\bar{y}_{k+1} - \bar{y}_k)^2 \rangle \tag{21}$$

where $\bar{y}_k$ is the k th measurement outcome and $\langle \ldots \rangle$ may indicate a time average or an ensemble average, depending on whether y(t) is assumed to be ergodic.

Deriving the Pair Covariance Transfer Function

In order to calculate covariances involving multiple measurement outcomes and obtaining a useful feedforward predictor, we disclose herein a way of capturing the correlations between different measurements in the frequency domain. Using the identity $\sigma^2(A \pm B) = \sigma^2(A) + \sigma^2(B) \pm 2\sigma(A,B)$, we define a sum and a difference sensitivity function: $g_{k,l}^+(t)$ and $g_{k,l}^-(t)$, with respect to two measurements indexed k and l. $g_{k,l}^+(t)$ and $g_{k,l}^-(t)$ are general functions of time with two regions of high sensitivity.

$$g_{k,l}^{\pm}(t) \equiv \begin{cases} g(t - t_k^s) \pm, & \text{for } t \in [t_k^s, t_k^e] \\ g(t - t_l^s), & \text{for } t \in [t_l^s, t_l^e] \\ 0, & \text{otherwise} \end{cases} \tag{22}$$

These time-domain sum and difference sensitivity functions have their corresponding frequency-domain transfer functions, defined as their Fourier transforms normalised by $T_R^{(k,l)}$:

$$G_{k,l}^{\pm}(\omega) \equiv \int_{-\infty}^{\infty} \left(\frac{g(t_k^m - t)}{T_R^{(k)}} \pm \frac{g(t_l^m - t)}{T_R^{(l)}}\right) e^{i\omega t} dt \tag{23}$$

Substituting this and the form of the true variance (18) into the variance identity above and rearranging terms gives the covariance of the two measurement outcomes $$\sigma(\bar{y}_k, \bar{y}_l) = \frac{1}{2\pi} \int_0^{\infty} \frac{S_y(\omega)}{4} (|G_{k,l}^+(\omega)|^2 - |G_{k,l}^-(\omega)|^2) d\omega \tag{24}$$

$$\equiv \frac{1}{2\pi} \int_0^{\infty} S_y(\omega) G_{k,l}^2(\omega) d\omega \tag{25}$$

whereby $G_{k,l}^2(\omega)$ is defined to be the pair covariance transfer function. Using (23), it is possible to recover known expressions for the true, Allan and sample variances pertaining to the LO, in terms of $S_y(\omega)$ and the appropriate transfer functions.

Calculating LLO Variances

The standard measures for oscillator performance consider either a free-running LO or provide a means only to statistically characterize measurement outcomes under black-box conditions. Here we present explicit analytic forms for different measurements of variance in the presence of feedback locking.

We initially make the link between LO and LLO variances via a time-domain treatment. Consider the trajectory of the same frequency noise realisation y(t) in the cases of no correction, $y^{LO}(t)$ and correction, $y^{LLO}(t)$. The relation between these two cases of y(t) is $$y^{LLO}(t) = y^{LO}(t) + \sum_{k=1}^{n} C_k \quad (26)$$

where $C_k$ refers to the value of the k th frequency correction applied to the LO, n of which have occurred before time t.

Under traditional feedback, each correction is directly proportional to the immediately preceding measurement outcome: $C_k = w_k \bar{y}_k^{LLO}$, where $w_k$ is correction gain. Since $\bar{y}_k^{LLO}$ is calculated by convolving $y^{LLO}(t)$ with a sensitivity function pertaining to the measurement parameters, (26) is a recursive equation in general. It is possible to cancel all but one of the recursive terms by setting the correction gain equal to the inverse of the average sensitivity $\bar{g}_k = \int_0^{T_R^{(k)}} g(t)/T_R^{(k)} dt$ of the preceding measurement, i.e. $w_k = -\bar{g}_k^{-1}$, where the minus sign indicates negative feedback. With this constraint we can write $$\bar{y}_k^{LLO} = \bar{y}_k^{LO} - \frac{\bar{g}_k}{\bar{g}_{k-1}} \bar{y}_{k-1}^{LO} \quad (27)$$

and for a Ramsey interrogation and measurement with negligibly short pulses, $\bar{g}_k = 1$.

The frequency variance of an LLO can be found straightforwardly, by substituting (26) into the definition of frequency variance, with the additional substitution of (27) for the particular case of traditional feedback:

$$\text{Var}[y^{LLO}(t)] = \langle y^{LLO}(t)^2 \rangle - \langle y^{LLO}(t) \rangle^2 \quad (28)$$

$$= \left\langle \left( y^{LO}(t) + \sum_{k=1}^{n} C_k \right)^2 \right\rangle \quad (29)$$

$$= \left\langle \left( y^{LO}(t) - \frac{\bar{y}_n^{LO}}{\bar{g}_n} \right)^2 \right\rangle \quad (30)$$

$$= \langle y^{LO}(t)^2 \rangle + \frac{1}{\bar{g}_n^2} \langle (\bar{y}_n^{LO})^2 \rangle - \frac{2}{\bar{g}_n} \langle y^{LO}(t) \bar{y}_n^{LO} \rangle \quad (31)$$

$$= \langle y^{LO}(t)^2 \rangle + \frac{\sigma_{yLO}^2(n)}{\bar{g}_n^2} - \frac{2}{\bar{g}_n} \sigma(y^{LO}(t), \bar{y}_n^{LO}) \quad (32)$$

where the progression from (29) to (30) is valid for traditional feedback only, and $\langle y^{LLO}(t) \rangle = 0$ by assumption and n indexes the last measurement before t.

Although the LLO frequency variance under hybrid feedforward for more than a single cycle cannot be expressed in a closed non-recursive form, a consideration of a single cycle can provide a value for $\langle y^{LLO}(t_k^c)^2 \rangle$ in terms of covariance matrix elements, which in turn provides a metric for the accuracy of the hybrid feedforward correction:

$$A_k \equiv \frac{\langle y^{LO}(t_k^c)^2 \rangle}{\langle y^{LLO}(t_k^c)^2 \rangle} \quad (33)$$

$$= \left( 1 + w_k^2 - w_k \frac{|F_k|^2}{\sqrt{F_k^T M_k F_k}} \right)^{-1} \quad (34)$$

The true variance for an LLO can found in a similar way by substituting (27) into the definition of true variance:

$$\sigma_{yLLO}^2(k) = \text{Var}[\bar{y}_k^{LLO}] \quad (35)$$

$$= \text{Var}\left[ \bar{y}_k^{LO} - \frac{\bar{g}_k}{\bar{g}_{k-1}} \bar{y}_{k-1}^{LO} \right] \quad (36)$$

$$= \sigma_{yLO}^2(k) + \left( \frac{\bar{g}_k}{\bar{g}_{k-1}} \right)^2 \sigma_{yLO}^2(k-1) - \quad (37)$$

$$\frac{2\bar{g}_k}{\bar{g}_{k-1}} \sigma(\bar{y}_{k-1}^{LO}, \bar{y}_k^{LO}) \quad (38)$$

where the appropriate forms of the measurement transfer function (18) and the pair covariance transfer function (25) can be substituted in to express $\sigma_{yLLO}^2(k)$ in terms of $S_y(\omega)$.

The expected value of the LLO sample variance can be found by substituting (26) into the definition of the sample variance, producing a generic expression for traditional feedback (one measurement per correction cycle) and hybrid feedforward (multiple measurements per cycle):

$$E[\sigma_{yLLO}^2[N]] = \frac{1}{N-1} \sum_{k'=1}^{N} \left\{ \sigma_{yLO}^2(k') + \frac{1}{N^2} \sum_{p'=1}^{N} \sum_{q'=1}^{N} \sigma(\bar{y}_{p'}^{LLO}, \bar{y}_{q'}^{LLO}) - \quad (39) \right.$$

$$\left. \frac{2}{N} \sum_{l'=1}^{N} \sigma(\bar{y}_{k'}^{LLO}, \bar{y}_{l'}^{LLO}) \right\}$$

$$= \frac{1}{N-1} \sum_{k'=1}^{N} \left\{ \left( \sigma_{yLO}^2(k') + \bar{g}_{k'}^2 \sum_{r=1}^{\lfloor k'/n \rfloor} \sum_{s=1}^{\lfloor k'/n \rfloor} \sigma(C_r, C_s) - \right. \right.$$

$$2\bar{g}_{k'} \sum_{u=1}^{\lfloor k'/n \rfloor} \sigma(\bar{y}_{k'}^{LO}, C_u) \right) +$$

$$\frac{1}{N^2} \sum_{p'=1}^{N} \sum_{q'=1}^{N} \sigma\left( \bar{y}_{p'}^{LO} + \bar{g}_{p'} \sum_{p=1}^{\lfloor p'/n \rfloor} C_p, \bar{y}_n^{LO} + \quad (40) \right.$$

$$\left. \bar{g}_{q'} \sum_{q=1}^{\lfloor q'/n \rfloor} C_q \right) - \frac{2}{N} \sum_{l'=1}^{N} \sigma\left( \bar{y}_{k'}^{LO} + \bar{g}_{k'} \sum_{u=1}^{\lfloor k'/n \rfloor} C_u, \bar{y}_{l'}^{LO} + \right.$$

$$\left. \left. \bar{g}_{l'} \sum_{v=1}^{\lfloor l'/n \rfloor} C_v \right) \right\}$$

$$= \frac{1}{N-1} \sum_{k'=1}^{N} \left\{ \left( \sigma_{yLO}^2(k') + \bar{g}_{k'}^2 \sum_{r=1}^{\lfloor k'/n \rfloor} \sum_{s=1}^{\lfloor k'/n \rfloor} \sigma(C_r, C_s) - \quad (41) \right. \right.$$

$$2\bar{g}_{k'} \sum_{u=1}^{\lfloor k'/n \rfloor} \sigma(\bar{y}_{k'}^{LO}, C_u) \right) + \frac{1}{N^2} \sum_{p'=1}^{N} \sum_{q'=1}^{N} \left( \sigma(\bar{y}_{p'}^{LO}, \bar{y}_{q'}^{LO}) + \right.$$

$$\left. \bar{g}_{p'} \bar{g}_{q'} \sum_{p=1}^{\lfloor p'/n \rfloor} \sum_{q=1}^{\lfloor q'/n \rfloor} \sigma(C_p, C_q) \right) -$$

$$\left. \frac{2}{N} \sum_{l'=1}^{N} \left( \sigma(\bar{y}_{k'}^{LO}, \bar{y}_{l'}^{LO}) + \bar{g}_{k'} \bar{g}_{l'} \sum_{k=1}^{\lfloor k'/n \rfloor} \sum_{l=1}^{\lfloor l'/n \rfloor} \sigma(C_k, C_l) \right) \right\}$$

where in this case of hybrid feedback, N is defined to be total number of measurements and n is the number of measurements per cycle. The summation signs with unprimed indices are sums over whole cycles (of which there are $\lfloor N/n \rfloor$) and the primed indices are sums over all N measurements. In general, $E[\sigma_{yLLO}^2[N]]$ contains recursive terms that cannot be concisely expressed in terms of the LO PSD $S_y(\omega)$ and covariance transfer function $G^2(\omega)$.

In the case of traditional feedback, the distinction between primes and unprimed indices disappears and the expression reduces to:

$$E[\sigma^2_{yLLO}[N]] = \tag{42}$$

$$\frac{1}{N-1}\sum_{k=1}^{N}\left\{\left(\sigma^2_{yLO}(k) + \bar{g}_k^2\sum_{r=1}^{k-1}\sum_{s=1}^{k-1}\sigma(C_r, C_s) - 2\bar{g}_k\sum_{u=1}^{k-1}\sigma(\bar{y}_k^{LO}, C_u)\right) + \right.$$

$$\frac{1}{N^2}\sum_{p=1}^{N}\sum_{q=1}^{N}\left(\sigma(\bar{y}_p^{LO}, \bar{y}_q^{LO}) + \bar{g}_p\bar{g}_q\sum_{w=1}^{p-1}\sum_{x=1}^{q-1}\sigma(C_x, C_y)\right) -$$

$$\left.\frac{2}{N}\sum_{l=1}^{N}\left(\sigma(\bar{y}_k^{LO}, \bar{y}_l^{LO}) + \bar{g}_k\bar{g}_l\sum_{y=1}^{k-1}\sum_{z=1}^{l-1}\sigma(C_y, C_z)\right)\right\}$$

where each term can be expressed in terms of $S_y(\omega)$ and $G^2(\omega)$.

The LLO Allan variance can be found by substituting (27) into the definition of the Allan variance (21):

$$A\sigma^2_{yLLO}(k) = \frac{1}{2}E\left[(\bar{y}_{k+1}^{LLO} - \bar{y}_k^{LLO})^2\right] \tag{43}$$

$$= \frac{1}{2}E\left[\left(\bar{y}_{k+1}^{LO} - \frac{\bar{g}_{k+1}}{\bar{g}_k}\bar{y}_k^{LO} - \bar{y}_k^{LO} + \frac{\bar{g}_k}{\bar{g}_{k-1}}\bar{y}_{k-1}^{LO}\right)^2\right] \tag{44}$$

$$= \frac{1}{2}\left(\sigma^2_{yLO}(k+1) + \left(1 + \frac{\bar{g}_{k+1}}{\bar{g}_k}\right)^2\sigma^2_{yLO}(k) + \right. \tag{45}$$

$$\left(\frac{\bar{g}_k}{\bar{g}_{k-1}}\right)^2\sigma^2_{yLO}(k-1) + \frac{2\bar{g}_k}{\bar{g}_{k-1}}\sigma(\bar{y}_{k+1}^{LO}, \bar{y}_{k-1}^{LO}) -$$

$$2\left(1 + \frac{\bar{g}_{k+1}}{\bar{g}_k}\right)\sigma(\bar{y}_k^{LO}, \bar{y}_{k+1}^{LO}) -$$

$$\left.\frac{2(\bar{g}_k + g_{k+1})}{\bar{g}_{k-1}}\sigma(\bar{y}_k^{LO}, \bar{y}_{k-1}^{LO})\right)$$

It will be appreciated by persons skilled in the art that numerous variations and/or modifications may be made to the specific embodiments without departing from the scope as defined in the claims.

It should be understood that the techniques of the present disclosure might be implemented using a variety of technologies. For example, the methods described herein may be implemented by a series of computer executable instructions residing on a suitable computer readable medium. Suitable computer readable media may include volatile (e.g. RAM) and/or non-volatile (e.g. ROM, disk) memory, carrier waves and transmission media. Exemplary carrier waves may take the form of electrical, electromagnetic or optical signals conveying digital data steams along a local network or a publicly accessible network such as the internet.

It should also be understood that, unless specifically stated otherwise as apparent from the following discussion, it is appreciated that throughout the description, discussions utilizing terms such as "estimating" or "processing" or "computing" or "calculating", "optimizing" or "determining" or "displaying" or "maximising" or the like, refer to the action and processes of a computer system, or similar electronic computing device, that processes and transforms data represented as physical (electronic) quantities within the computer system's registers and memories into other data similarly represented as physical quantities within the computer system memories or registers or other such information storage, transmission or display devices.

The present embodiments are, therefore, to be considered in all respects as illustrative and not restrictive.

REFERENCES

[1] Hagemann, C. and Grebing, C. and Kessler, T. and Falke, S. and Lemke, N. and Lisdat, C. and Schnatz, H. and Riehle, F. and Sterr, U. Providing $10^{-16}$ Short-Term Stability of a 1.5-μm Laser to Optical Clocks. Instrumentation and Measurement, IEEE Transactions on, 62(6):1556-1562, 2013.

[2] Rutman, J. Characterization of phase and frequency instabilities in precision frequency sources: Fifteen years of progress. Proceedings of the IEEE, 66(9):1048-1075, 1978.

What is claimed is:

1. A computer implemented method for controlling an oscillator, the method comprising:
    determining a first statistical correlation between multiple error values, each error value being indicative of a measurement of a frequency difference between the oscillator and a frequency reference over a period of time, and
    determining a control value to control the oscillator by maximising a second statistical correlation between a frequency difference at a time of application of the control value to the oscillator and a correction caused by the application of the control value, the frequency difference being a statistical variable estimated based on the first statistical correlation and an application time value indicative of the time of application of the control value to the oscillator.

2. The method of claim 1, wherein
    each of the multiple error values is associated with a measurement time value indicative of a time of the measurement of the frequency difference, and
    determining the control value comprises determining the control value based on the measurement time value associated with each of the multiple error values.

3. The method of claim 1, wherein determining the control value comprises determining the control value based on noise data indicative of statistical noise characteristics of the oscillator.

4. The method of claim 3, wherein the noise data is indicative of a noise power spectrum.

5. The method of claim 1, wherein determining the control value comprises:
    determining multiple weighting coefficients for the multiple error values based on the multiple error values; and
    determining the control value to control the oscillator based on the multiple error values modified according to the multiple weighting coefficients.

6. The method of claim 5, wherein determining the control value comprises determining a linear combination of the multiple error values weighted by the multiple weighting coefficients.

7. The method of claim 1, wherein
    each of the multiple error values is associated with a measurement duration value indicative of a duration of the measurement of the frequency difference, and
    determining the control value comprises determining the control value based on the measurement duration value associated with each of the multiple error values.

8. The method of claim 6, wherein
    the multiple error values comprise a first error value associated with a first measurement duration value indicative of a first duration of a first measurement of the frequency difference and a second error value associated with a second measurement duration value indicative of a second duration of a second measurement of the frequency difference, the first duration of the first measurement is relatively long to sample low frequency noise of the oscillator, and the second duration of the second measurement is relatively short to sample high frequency noise of the oscillator.

9. The method of claim 7, wherein the duration of the measurement is defined between two exposure periods of the frequency reference to the frequency of the oscillator such that each of the multiple error values is indicative of an accumulated phase difference between the oscillator and the frequency reference.

10. The method of claim 7, further comprising performing an optimisation to determine the multiple duration values for obtaining the multiple error values.

11. The method of claim 1, wherein determining the control value comprises determining the control value based on a transfer function indicative of an influence of fluctuations of the oscillator on the multiple error values.

12. The method of claim 11, further comprising determining a covariance matrix based on the transfer function wherein determining the control value comprises determining the control value based on the covariance matrix.

13. A non-transitory computer readable medium with an executable program stored thereon that when executed causes the computer to perform the method of claim 1.

14. A computer system for controlling an oscillator, the computer system comprising:

an input port to receive multiple error values, each error value being indicative of a measurement of a frequency difference between the oscillator and a frequency reference over a period of time; and a processor
to determine a first statistical correlation between the multiple error values; and
to determine a control value to control the oscillator by maximising a second statistical correlation between a frequency difference at the time of application of the control value to the oscillator and a correction caused by the application of the control value, the frequency difference being a statistical variable estimated based on the first statistical correlation and an application time value indicative of the time of application of the control value to the oscillator.

15. A method for generating a clock signal, the method comprising:

generating the clock signal based on oscillations of an oscillator;

performing multiple measurements of a frequency difference between the oscillator and a frequency reference over a period of time;

determining multiple error values such that each error value is indicative of one of the multiple measurements;

determining a first statistical correlation between the multiple error values;

determining a control value to control the oscillator by maximising a second statistical correlation between a frequency difference at a time of application of the control value to the oscillator and a correction caused by the application of the control value, the frequency difference being a statistical variable estimated based on the first statistical correlation and an application time value indicative of the time of application of the control value to the oscillator; and applying the control value to the oscillator at the time of application.

16. The method of claim 15, wherein measuring the frequency difference comprises measuring an accumulated phase difference.

17. A clock comprising:

an oscillator and a detector to generate a clock signal based on oscillations of the oscillator;

a frequency reference;

a measurement system
to perform multiple measurements of a frequency difference between the oscillator and the frequency reference over a period of time; and a processor
to determine multiple error values such that each error value is indicative of one of the multiple measurements;
to determine a first statistical correlation between the multiple error values;
to determine a control value to control the oscillator by maximising a second statistical correlation between a frequency difference at a time of application of the control value to the oscillator and a correction caused by the application of the control value, the frequency difference being a statistical variable estimated based on the first statistical correlation and an application time value indicative of the time of application of the control value to the oscillator; and
to apply the control value to the oscillator at the time of application.

18. The clock of claim 17, wherein the frequency reference is an atomic frequency reference.

* * * * *